(12) United States Patent
Kim et al.

(10) Patent No.: US 9,833,943 B2
(45) Date of Patent: Dec. 5, 2017

(54) BACK SHEET FOR SOLAR CELL MODULE AND METHOD FOR MANUFACTURING THE SAME

(71) Applicant: KOLON INDUSTRIES, INC., Gwacheon-si, Gyeonggi-do (KR)

(72) Inventors: Yun Jo Kim, Gumi-si (KR); Dong-Hyeon Choi, Gyeongsan-si (KR); Si Min Kim, Daegu (KR)

(73) Assignee: KOLON INDUSTRIES, INC., Gwacheon-si (KR)

( * ) Notice: Subject to any disclaimer, the term of this patent is extended or adjusted under 35 U.S.C. 154(b) by 338 days.

(21) Appl. No.: 14/380,572

(22) PCT Filed: Feb. 21, 2013

(86) PCT No.: PCT/KR2013/001370
§ 371 (c)(1),
(2) Date: Aug. 22, 2014

(87) PCT Pub. No.: WO2013/125870
PCT Pub. Date: Aug. 29, 2013

(65) Prior Publication Data
US 2015/0027530 A1 Jan. 29, 2015

(30) Foreign Application Priority Data
Feb. 23, 2012 (KR) .................. 10-2012-0018622

(51) Int. Cl.

| | | |
|---|---|---|
| C08L 67/02 | (2006.01) | |
| C08L 67/03 | (2006.01) | |
| H01L 31/049 | (2014.01) | |
| C08K 3/22 | (2006.01) | |
| C08K 5/09 | (2006.01) | |
| C08K 5/3415 | (2006.01) | |
| C08K 5/3417 | (2006.01) | |
| B32B 27/36 | (2006.01) | |
| B29D 7/01 | (2006.01) | |
| B29C 47/00 | (2006.01) | |
| B29C 47/38 | (2006.01) | |
| B29C 47/40 | (2006.01) | |
| B29C 47/60 | (2006.01) | |
| B29C 47/68 | (2006.01) | |
| B29C 55/04 | (2006.01) | |
| B29C 55/12 | (2006.01) | |
| C08J 3/22 | (2006.01) | |
| B29C 47/76 | (2006.01) | |
| H02S 40/22 | (2014.01) | |
| B29C 47/92 | (2006.01) | |
| B29K 67/00 | (2006.01) | |
| B29K 105/00 | (2006.01) | |
| B29L 7/00 | (2006.01) | |
| C08K 3/00 | (2006.01) | |
| C08K 5/00 | (2006.01) | |

(52) U.S. Cl.
CPC .......... *B29C 55/12* (2013.01); *B29C 47/0021* (2013.01); *B29C 47/40* (2013.01); *B29C 47/766* (2013.01); *B29C 47/92* (2013.01); *B29C 55/04* (2013.01); *H01L 31/049* (2014.12); *H02S 40/22* (2014.12); *B29C 47/00* (2013.01); *B29C 47/0004* (2013.01); *B29C 47/0057* (2013.01); *B29C 47/38* (2013.01); *B29C 47/60* (2013.01); *B29C 47/68* (2013.01); *B29C 2947/92704* (2013.01); *B29D 7/01* (2013.01); *B29K 2067/00* (2013.01); *B29K 2067/003* (2013.01); *B29K 2105/0032* (2013.01); *B29K 2995/003* (2013.01); *B29K 2995/0025* (2013.01); *B29L 2007/008* (2013.01); *B32B 27/36* (2013.01); *B32B 2457/12* (2013.01); *C08J 3/22* (2013.01); *C08J 3/226* (2013.01); *C08K 3/0033* (2013.01); *C08K 3/22* (2013.01); *C08K 5/0041* (2013.01); *C08K 5/09* (2013.01); *C08K 5/3415* (2013.01); *C08K 5/3417* (2013.01); *C08K 2003/2241* (2013.01); *C08L 67/02* (2013.01); *C08L 67/03* (2013.01); *Y02E 10/52* (2013.01)

(58) Field of Classification Search
None
See application file for complete search history.

(56) References Cited

U.S. PATENT DOCUMENTS

| | | | | |
|---|---|---|---|---|
| 3,607,818 A | * | 9/1971 | Trubisky | .......... C08K 3/04 430/533 |
| 5,039,760 A | * | 8/1991 | Nakane | .......... C08G 63/20 525/437 |
| 5,807,966 A | * | 9/1998 | Pfaendner | .......... C08G 63/78 521/48 |

(Continued)

FOREIGN PATENT DOCUMENTS

| | | | |
|---|---|---|---|
| CN | 102653625 A | * | 9/2012 |
| JP | 08-048793 A | | 2/1996 |

(Continued)

OTHER PUBLICATIONS

"Wikipedia—Mesh (Scale)" (http://en.wikipedia.org/wiki/Mesh_(scale)) webpage retrieved Jun. 11, 2016.*

(Continued)

*Primary Examiner* — Vivian Chen
(74) *Attorney, Agent, or Firm* — Sughrue Mion, PLLC

(57) ABSTRACT

Provided are a polyester white film and a back sheet for a solar cell module using the same, and in particular, provided is a polyester white film having improved light reflectance.

6 Claims, No Drawings

(56) References Cited

U.S. PATENT DOCUMENTS

| | | | | |
|---|---|---|---|---|
| 8,912,427 B2* | 12/2014 | Ikehata | ............... | B32B 27/08 136/251 |
| 2002/0065346 A1* | 5/2002 | Murschall | ............... | B32B 27/18 524/323 |
| 2002/0136875 A1* | 9/2002 | Murschall | ............... | B32B 27/36 428/212 |
| 2002/0160215 A1* | 10/2002 | Peiffer | ............... | B29C 55/143 428/480 |
| 2002/0176978 A1* | 11/2002 | Murschall | ............... | B32B 27/08 428/220 |
| 2002/0187328 A1* | 12/2002 | Murschall | ............... | C08J 5/18 428/220 |
| 2004/0151877 A1* | 8/2004 | Suh | ............... | B32B 27/36 428/141 |
| 2006/0135668 A1* | 6/2006 | Hayes | ............... | B32B 27/36 524/430 |
| 2006/0210768 A1* | 9/2006 | Masuda | ............... | B29C 33/68 428/141 |
| 2006/0270806 A1* | 11/2006 | Hale | ............... | C08J 5/18 525/439 |
| 2006/0275593 A1* | 12/2006 | Kern | ............... | B32B 27/08 428/220 |
| 2008/0125518 A1* | 5/2008 | Mediratta | ............... | C08G 63/916 523/457 |
| 2009/0065055 A1* | 3/2009 | Fujii | ............... | B32B 27/20 136/259 |
| 2009/0123756 A1* | 5/2009 | Hashimoto | ............... | B32B 5/18 428/409 |
| 2009/0176913 A1* | 7/2009 | Horikoshi | ............... | C08K 5/0091 524/83 |
| 2009/0250831 A1* | 10/2009 | Effenberger | ............... | C08G 63/183 264/78 |
| 2010/0120946 A1* | 5/2010 | Kliesch | ............... | C08J 5/18 523/400 |
| 2010/0229924 A1* | 9/2010 | Teranishi | ............... | B32B 27/36 136/252 |
| 2010/0292375 A1* | 11/2010 | Kliesch | ............... | B32B 27/36 524/114 |
| 2011/0192552 A1* | 8/2011 | Kliesch | ............... | B29C 47/0021 160/166.1 |
| 2011/0192553 A1* | 8/2011 | Kliesch | ............... | B29C 47/0021 160/166.1 |
| 2011/0209747 A1* | 9/2011 | Shi | ............... | B29C 47/0021 136/251 |
| 2011/0277834 A1* | 11/2011 | Hatakeyama | ............... | H01L 31/049 136/256 |
| 2011/0284075 A1* | 11/2011 | Hatakeyama | ............... | H01L 31/049 136/259 |
| 2011/0297222 A1* | 12/2011 | Takegami | ............... | C08G 63/85 136/256 |
| 2011/0306747 A1* | 12/2011 | Hashimoto | ............... | C08J 5/18 528/83 |
| 2012/0028019 A1* | 2/2012 | Kori | ............... | B29C 47/0019 428/220 |
| 2012/0167976 A1* | 7/2012 | Aoyama | ............... | H01L 31/048 136/256 |
| 2013/0340830 A1* | 12/2013 | Aritoshi | ............... | B32B 27/36 136/259 |

FOREIGN PATENT DOCUMENTS

| | | | | |
|---|---|---|---|---|
| JP | 2001-010002 A | | | 1/2001 |
| JP | 2001-232737 A | | | 8/2001 |
| JP | 2008-069217 | | * | 3/2008 |
| JP | 2008-069217 A | | * | 3/2008 |
| JP | 5728944 B | | * | 6/2015 |
| KR | 10-2001-0082751 A | | | 8/2001 |
| KR | 10-2012-0009438 A | | | 1/2012 |
| TW | 201037840 A1 | | | 10/2010 |
| WO | WO 2010/110119 | | * | 9/2010 |
| WO | WO 2010-110119 A | | * | 9/2010 |
| WO | WO 2010/137099 | | * | 12/2010 |
| WO | WO 2012-132756 A | | * | 10/2012 |

OTHER PUBLICATIONS

"Wikipedia—Fatty Acid" (https://en.wikipedia.org/wiki/Fatty_acid) (webpage retrieved May 14, 2017).*
State Intellectual Property Office of the P.R.C., Communication dated Jan. 8, 2016, issued in corresponding Chinese Application No. 201380021607.1.
International Searching Authority, International Search Report of PCT/KR2013/001370 dated May 16, 2013 [PCT/ISA/210].

* cited by examiner

BACK SHEET FOR SOLAR CELL MODULE AND METHOD FOR MANUFACTURING THE SAME

CROSS REFERENCE TO RELATED APPLICATIONS

This is a National Stage of International Application No. PCT/KR2013/001370 filed Feb. 21, 2013, claiming priorities based on Korean Patent Application Nos. 10-2012-0018622 filed Feb. 23, 2012 and 10-2013-0017905 filed Feb. 20, 2013, the contents of all of which are incorporated herein by reference in their entirety.

FIELD OF THE INVENTION

The present invention relates to a polyester white film and a back sheet for a solar cell module using the same, and more particularly, to a polyester white film having improved light reflectance.

BACKGROUND OF THE INVENTION

A solar cell for solar light generation start from various compounds such as silicon and the like, and can generate electricity in a solar cell type. However, even one cell does not obtain a sufficient output, and thus respective cells are connected in series or in parallel. This connection state is called a 'solar cell module'.

The solar cell module is constituted by laminating glass, ethylene vinylacetate (EVA), solar cells, ethylene acetate (EVA), and a back sheet. The back sheet is laminated at the bottom in the module to block dust, impact, and moisture and thus serve to protect the solar cells. A Tedlar/PET/Tedlar (TPT) type back sheet is mostly used, and since a ribbon is used as a passage for allowing current to flow therethrough, a copper material coated with silver or tin lead is used.

The back sheet for a solar cell module is a key material which is attached on the outermost back surface of the solar cell module to protect cells. The back sheet needs characteristics such as durability, weather resistance, insulation, water vapor transmission, and the like, and manufactured by laminating a fluorine film and a PET film.

A fluorine film having superior weather resistance and durability is used. Currently, the Tedlar film formed of PVF resin, developed by the DuPont Company in 1961, has been used, but it is substituted with other films such as PET and the like by some manufactures due to high price and short supply.

EVA was developed as a material for a solar cell used in the satellite by NASA and the DuPont Company jointly in 1970. It is used as a standard of a sealing material for a solar cell. More than 70% of the world market is dominated by Japanese companies (Mitsui Chemical, Bridgestone, etc.). It serves to seal and fill cells inside the solar cell. It has superior strength, transparency, and insulating property.

For a polyethylene terephthalate (PET) film, a surface type plastic film having uniform thickness and constant physical properties is used, which constitutes a basic framework of the back sheet due to superior strength. It has superior physical, chemical, mechanical, and optical properties, and thus is widely used ranging from food packaging and office products to high-technology electrical electronic products such as semiconductor devices, displays, and the like. Recently, it has been increasingly used for a back sheet for a solar cell due to superior durability and weather resistance thereof.

Glass low in iron may be utilized to serve to prevent light reflection.

In the Tedlar/PET/Tedlar (TPT) type back sheet of the related art, a process of laminating the Tedlar film and the PET film through respective adhesives is needed, and a process of adhering the back sheet and the EVA film as a sealing material through a polyurethane adhesive or the like is further needed. Since the Tedlar film used in the existing back sheet is high-priced, it currently accounts for 80% or more of the manufacture process cost of the back sheet, which causes an increase in cost of the back sheet.

Therefore, studies on the polyester film that substitutes for the Tedlar film to lower the manufacturing unit cost have been actively conducted.

Korean Patent Laid-Open Publication No. 10-2011-0118953 (2011 Nov. 2) discloses that an ethylene vinyl acetate film adhesive layer is formed on a polyester film through in-line coating in order to substitute for the Tedlar film, and Korean Patent Laid-Open Publication No. 10-2011-0119134 (2011 Nov. 2) discloses that a hot-melt adhesive layer is formed on a polyester film through in-line coating in order to substitute for the Tedlar film. Korean Patent Laid-Open Publication No. 10-2011-0118271 (2011 Oct. 31) discloses that a fluorine-coating layer is formed by coating a fluorine-coating composition substituting for the existing Tedlar film on a polyester film through off-line coating, to thereby reduce the process and cost.

As such, conventional studies are about the formation of other functional layers for substituting for the Tedlar film.

In the solar light generation, characteristics needed for the back sheet may be adhesion, long-term durability, light reflectance for improving generation efficiency, In the case of the sun light module, the generation efficiency is deteriorated with the rising temperature. Therefore, when a film having high light reflectance is applied thereto, the generation efficiency can be increased by blocking the temperature increase due to light reflection and recycling the solar light.

Therefore, a lot of studies on a back sheet for a solar cell module having high light reflectance and superior long-term durability are proceeding.

DETAILED DESCRIPTION OF THE INVENTION

Technical Problem

An embodiment of the present invention is directed to providing a film having superior hydrolysis resistance and high light reflectance even without the Tedlar film by improving physical properties of a polyester film itself, instead of forming a functional layer substituting for the existing Tedlar film, and also providing a back sheet for a solar cell module including the polyester white film.

Specifically, an embodiment of the present invention is directed to providing a white film for a back sheet for a solar cell module, made of polyester resin, capable of solving the problems of cost increase and imbalance between supply and demand caused by using the existing fluororesin, and improving light reflectance and thus increasing generation efficiency of the solar cell module.

Another embodiment of the present invention is directed to providing a white film having superior weather resistance, increased light efficiency by recovering light to solar cells due to excellent light reflectance, and superior hydrolysis resistance, in order to be used for a back sheet for a solar cell module.

Still another embodiment of the present invention is directed to providing a white film using a particular combination of inorganic particles and a florescence whitening agent in order to satisfy an optical characteristic of 90% or higher of light reflectance at a visible light region of 550 nm.

Technical Solution

The present invention for achieving the above objects is as follows.

In one general aspect, a polyester white film has a whiteness index of 100 or higher, reflectance of 90% or higher at 550 nm, MD thermal shrinkage of 2.0% or lower at 150° C. after 30 minutes, a color difference ($\Delta E$) of 2.0 or less after irradiation of QUV (1.23 W/m$^2$×340 nm×60° C.×99 hours), and MD elongation retention of 50% or higher at 121° C. and RH 100% after 50 hours.

The polyester white film may include a matrix resin made of a polyester resin, rutile type titanium dioxide, and a benzoxazole based fluorescence whitening agent.

The rutile type titanium dioxide may be contained in a content of 10~20 wt % and the benzoxazole based fluorescence whitening agent may be contained in a content of 100~900 ppm, based on the total weight of the film.

The rutile type titanium dioxide may have an average particle size of 0.1~0.5 μm.

The polyester white film may further include an additive selected from an oxazoline based thickener, oleic acid, and mixtures thereof.

The oxazoline based thickener may be contained in a content of 50~700 ppm based on the total weight of the film, and the oleic acid may be contained in a content of 40~400 ppm based on the total weight of the film.

The polyester resin may be polyethylene terephthalate.

The polyester white film may be used for a back sheet for a solar cell module.

In another general aspect, a back sheet for a solar cell module, the back sheet is made of the polyester white film, or includes one or more layers of the polyester white film.

In still another general aspect, a method for manufacturing a polyester white film, the method includes:

a) preparing a first master batch chip by mixing a polyester resin powder obtained by pulverizing a first polyester resin chip, rutile type titanium dioxide, and a benzoxazole based fluorescence whitening agent, followed by melt-extrusion at an extruder temperature of 240~265° C.;

b) preparing an unstretched sheet by feeding the first master batch chip and a second polyester resin chip into an extruder, followed by melt-extrusion at a temperature of 280~320° C.; and c) preparing a film by uniaxially or biaxially stretching the unstretched sheet.

Here, in the step b), the content of the first master batch chip may include 10~20 wt % of rutile type titanium dioxide and 100~900 ppm of a benzoxazole based fluorescence whitening agent, based on the total weight of the film.

Here, in the step a), at the time of preparing the first master batch chip, an additive selected from oxazoline based thickener, oleic acid, and mixtures thereof may be further mixed.

The oxazoline based thickener may be added in a content of 50~700 ppm based on the total weight of the film, and the oleic acid is added in a content of 40~400 ppm based on the total weight of the film.

Here, in the step a), at the time of preparing the first master bath chip, a twin screw extruder with a vacuum vent may be used while the extruder temperature is 240~265° C. and the retention time of polymer within the extruder is 1 minute or less, and a 300~500 mesh screen change filter at the front end of the twin screw extruder may be used to implement uniform mixing.

The polyester white film may have a whiteness index of 100 or higher, reflectance of 90% or higher at 550 nm, MD thermal shrinkage of 2.0% or lower at 150° C. after 30 minutes, a color difference ($\Delta E$) of 2.0 or less after irradiation of QUV (1.23 W/m$^2$×340 nm×60° C.×99 hours), and MD elongation retention of 50% or higher at 121° C. and RH 100% after 50 hours.

Effect of the Invention

As set forth above, the polyester white film according to the present invention can have high light reflectance, weather resistance, durability, and mechanical strength.

Therefore, the polyester white film according to the present invention has high light reflectance to thereby prevent the increase in temperature of the solar cell module in an external environment, and has superior solar light generation efficiency by photo-recycling due to light reflectance characteristics, and thus is appropriate for a back sheet for a solar cell module.

Further, the polyester white film according to the present invention can be applied to the outermost layer of the back sheet due to excellent weather resistance and long-term durability thereof, and thus be substituted for the existing fluorine film, resulting in saving the manufacturing cost, and can provide excellent back sheet manufacturing processability due to high thermal shape stability and maintain beautiful appearances due to UV stability.

EMBODIMENTS FOR CARRYING OUT THE INVENTION

Hereinafter, the present invention will be described in more detail.

The present invention is directed to provide a polyester white film, and according to the present invention, the existing lamination structure of Tedlar film/PET film/Tedlar film is substituted for a film made of only the polyester film. The present invention is directed to a white film for a back sheet for a solar cell module, made of the white film of the present invention or including one or more layers of the white films of the invention film.

The present inventors studied that the back sheet of the related art, in which fluorine films are attached on both surfaces of the polyethylene terephthalate (PET) film, is substituted for a film entirely made of a polyester resin. As a result, the present inventors found that, in order to increase the light efficiency by blocking light to return the light to the solar cells, high reflectance, weather resistance, and hydrolysis resistance need to be satisfied; inorganic particles need to be included in order to satisfy the above physical properties; and rutile type titanium dioxide is used for the inorganic particles while the content thereof is regulated and the benzoxazole based fluorescence whitening agent is mixed therewith, so that desired light reflectance could be achieved. Based on these studies, the present invention was completed.

A first aspect of the present invention is a polyester white film including a matrix resin made of a polyester resin, rutile type titanium dioxide, and a benzoxazole based fluorescence whitening agent, and having a whiteness index of 100 or higher, reflectance of 90% or higher at 550 nm, MD thermal shrinkage of 2.0% or lower at 150° C. after 30 minutes, a color difference (ΔE) of 2.0 or less after irradiation of QUV (1.23 W/m²×340 nm×60° C.×99 hours), and MD elongation retention of 50% or higher at 121° C. and RH 100% after 50 hours.

A second aspect of the present invention is a polyester white film including a matrix resin made of a polyester resin, rutile type titanium dioxide, a benzoxazole based fluorescence whitening agent, and an oxazoline based thickener, and having a whiteness index of 100 or higher, reflectance of 90% or higher at 550 nm, MD thermal shrinkage of 2.0% or lower at 150° C. after 30 minutes, a color difference (ΔE) of 2.0 or less after irradiation of QUV (1.23 W/m²×340 nm×60° C.×99 hours), and MD elongation retention of 50% or higher at 121° C. and RH 100% after 50 hours.

A third aspect of the present invention is a polyester white film including a matrix resin made of a polyester resin, rutile type titanium dioxide, a benzoxazole based fluorescence whitening agent, and oleic acid, and having a whiteness index of 100 or higher, reflectance of 90% or higher at 550 nm, MD thermal shrinkage of 2.0% or lower at 150° C. after 30 minutes, a color difference (ΔE) of 2.0 or less after irradiation of QUV (1.23 W/m²×340 nm×60° C.×99 hours), and MD elongation retention of 50% or higher at 121° C. and RH 100% after 50 hours.

A fourth aspect of the present invention is a polyester white film including a matrix resin made of a polyester resin, rutile type titanium dioxide, a benzoxazole based fluorescence whitening agent, an oxazoline based thickener, and oleic acid, and having a whiteness index of 100 or higher, reflectance of 90% or higher at 550 nm, MD thermal shrinkage of 2.0% or lower at 150° C. after 30 minutes, a color difference (ΔE) of 2.0 or less after irradiation of QUV (1.23 W/m²×340 nm×60° C.×99 hours), and MD elongation retention of 50% or higher at 121° C. and RH 100% after 50 hours.

The above aspects of the present invention are illustrated by examples, but are not limited thereto.

The polyester white film of the present invention may be used for a back sheet for a solar cell module.

Further, a back sheet for a solar cell module, which is made of the polyester white film or including one or more layers of the polyester white films, is also included in the scope of the present invention.

Hereinafter, respective constitutions of the present invention will be described in more detail.

The polyester resin is a generic term of a polymer where a covalent bond linking a monomer residue and a monomer residue, which is a main bond in the main chain, is an ester bond, and may be generally obtained by condensation polymerization of a dicarboxylic acid compound and a dihydroxy compound or a dicarboxylic acid ester derivative and a dihydroxy compound.

Here, examples of the dicarboxylic acid compound may be aromatic dicarboxylic acids such as terephthalic acid, 2,6-naphthalene dicarboxylic acid, isophthalic acid, diphenyl dicarboxylic acid, diphenyl sulfone dicarboxylic acid, diphenoxy ethane dicarboxylic acid, 5-sodium sulfoisophthalic acid, phthalic acid, and the like; aliphatic dicarboxylic acids such as oxalic acid, succinic acid, adipic acid, sebasic acid, dimer acid, maleic acid, fumaric acid, and the like: alicyclic dicarboxylic acids such as cyclohexane dicarboxylic acid and the like; oxycarboxylic acids such as para-oxy-benzoic acid and the like.

In addition, examples of the dicarboxylic acid ester derivative may be esterified compound of the dicarboxylic acid compounds, for example, terephthalic acid methyl, terephthalic acid diethyl, terephthalic acid 2-hydroxy-ethyl methyl ester, 2,6-naphthalene dicarboxylic acid dimethyl, isophthalic acid dimethyl, adipic acid dimethyl, maleic acid dimethyl, dimeric acid dimethyl, and the like.

Examples of the hydroxy compound may be aliphatic hydroxy compounds such as ethylene glycol, 1,2-propanediol, 1,3-propanediol, 1,3-butanediol, 1,4-butanediol, 1,5-pentane diol, 1,6-hexane diol, neopentyl glycol, and the like; polyoxy alkylene glycols such as diethylene glycol, polyethylene glycol, polypropylene glycol, polytetramethylene glycol, and the like; alicyclic dihydroxy compounds such as 1,4-cyclohexane dimethanol, and the like; and aromatic dihydroxy compounds such as bisphenol A, bisphenol S, and the like.

Of these, terephthalic acid, 2,6-naphthalene dicarboxylic acid, isophthalic acid, and the like may be preferably used as the dicarboxylic acid compound, and neopentyl glycol, ethylene glycol, 1,3-propane diol, 1,4-butanediol, polytetramethylene glycol, 1,4-cyclohexane dimethanol, and the like may be preferably used as the dihydroxy compound.

Of these, polyethylene terephthalate (PET) made of terephthalic acid or terephthalic acid dimethyl and ethylene glycol may be preferably used.

In one aspect of the present invention, rutile type titanium dioxide reflects the light passing through solar cells to return the light to the cells to thereby increase light efficiency, and blocks the UV, which transmits a PET film constituting the back sheet, to thereby suppress photodegradation of PET. The present invention is characterized by using rutile type titanium dioxide. The use of rutile type titanium dioxide shifts the light absorption region toward long wavelengths to decrease activity of photocatalyst, thereby suppressing photodegradation by UV and thus improving durability. The content thereof is preferably 1020 wt % of the total weight of the white film. If the content thereof is below 10 wt %, the whiteness index and reflectance are low, which may be difficult to apply to a back sheet for a solar cell module as a single film. If the content thereof is above 20 wt %, the casting sheet is highly crystallized, which may cause sheet brittleness and fragileness resulting in difficult stretching, and thus film-forming stability may be severely deteriorated. In addition, even though the content thereof leads to a film having sufficient reflectance, PCT (pressure cooker test: 121° C.×RH100%×50 hours) characteristics, which are required for a back sheet for a solar cell module, are deteriorated, which may be difficult to apply to a back sheet.

With respect to the PCT characteristics, a sample (MD×TD lengths; 300 mm×200 mm) is cut at an interval of 15 mm in a TD and 200 mm in an MD based on one corner by a knife ten times, so that a film having a size of 200 mm×15 mm (MD×TD) is hung at one sample. After that, a hole is punched in the sample at a position of 270 mm from a cut start point in the TD. This sample is hung at a sample hanger inside an autoclave such that it is not immersed in water, and then subjected to aging for 50 hours under the conditions of high temperature and high humidity at 121° C.×100% RH×2 bar. Upon completion of the aging, the sample is taken out of the autoclave. The sample is maintained at room temperature for 24 hours, and then physical properties thereof are measured, which mean PCT characteristics.

In addition, the inorganic particle has an average particle size of preferably 0.1~0.5 μm, and more preferably 0.2~0.40 μm. If the average particle size thereof is below 0.1 μm, fine particles reagglomerate, resulting in defective dispersibility, and thus the filter is frequently stopped in a film-forming process, which may cause deteriorated workability. If above 0.5 μm, the distance between particles is increased during a stretching process due to a large particle size, resulting in a decrease in stretching property, which may cause defective workability such as a fracture or the like. Moreover, even the same content of particles decreases the reflectance, and in the case where the particle content is increased in order to achieve the required reflectance, economic feasibility may be decreased due to an increase in the manufacturing cost and deterioration in processability.

In addition, the florescence whitening agent is included in order to increase reflectance and whiteness index of the film, and preferably, benzoxazole fluorescence whitening agent may be contained in a content of 100~900 ppm based on the total content of the film. If the content thereof is below 100 ppm, the whiteness index is deteriorated and thus the light reflectance is decreased. If above 900 ppm, the whiteness index and light reflectance are increased but UV stability is deteriorated, which may cause a yellowing phenomenon at the time of being exposed to an external environment, and eventually, the whiteness index and light reflectance may be lowered.

Specific examples of the benzoxazole based fluorescence whitening agent may be 2,5-thiophenediylbis(5-tert-butyll-1,3-benzooxazole), 4,4-bis(2-methoxystryryl)-1,1'-biphenyl, 2,2'-(1,2-ethenediyldi-4,1-phenylene)bisbenzoxazole, and the like. Commercialized examples thereof may be OB-1 from the Eastman Company and the like, but are not limited thereto.

The present invention may further include an additive in the matrix resin as necessary, and preferably include at least one kind of inorganic particle, UV stabilizer, antioxidant, heat-resistant stabilizer, or the like, as an additive.

In an aspect of the present invention, the polyester white film may further include an additive selected from an oxazoline based thickener, oleic acid, and mixtures thereof.

Specifically, the oxazoline based thickener may be included in a content of 50~700 ppm based on the total weight of the film, and the oleic acid may be included in a content of 40~400 ppm based on the total weight of the film.

Since thermal degradation of the polymer may result in lowering the viscosity at the time of manufacturing a first master batch chip, the oxazoline based thickener is used to increase the viscosity to thereby improve film manufacturing processability and prevent the deterioration in physical properties. Here, oxazoline based thickener is included in a content of preferably 50~700 ppm and more preferably 400~600 ppm based on the total weight of the film. If the content thereof is below 50 ppm, the effect of increasing a molecular weight due to the thickener is not sufficient, and thus it does not influence the film manufacturing processability and deterioration in physical properties. If above 700 ppm, the filter pressure is extremely high, resulting in deteriorating the film manufacturing processability.

The oleic acid is used to improve dispersibility of the fluorescence whitening agent, and is included in a content of 40~400 ppm and more preferably 200~300 ppm based on the total weight of the film. If the content thereof is below 40 ppm, the effect thereof is slight. If above 400 ppm, the film surface may be contaminated, resulting in lowering the whiteness index and light reflectance.

Next, a method for manufacturing a polyester white film of the present invention includes:

a) preparing a first master batch chip by mixing a polyester resin powder obtained by pulverizing a first polyester resin chip, rutile type titanium dioxide, and a benzoxazole based fluorescence whitening agent, followed by melt-extrusion at an extruder temperature of 240~265° C.;

b) preparing an unstretched sheet by feeding the first master batch chip and a second polyester resin chip into an extruder, followed by melt-extrusion at a temperature of 280~320° C.; and c) preparing a film by uniaxially or biaxially stretching the unstretched sheet.

In the step a), the first master batch is prepared in order to uniformly mix the rutile type titanium dioxide and the benzoxazole based fluorescence whitening agent with the polyester resin chip. The polyester resin chip is pulverized into a powder type at room temperature in order to increase mixability with two kinds of different types of materials, and the respective materials are mixed at a predetermined ratio by using a quantitative feeder, which are then feed into the extruder. The used extruder is preferably a twin-crew extruder installed with a vacuum vent apparatus.

Preferably, the first master batch having melt viscosity (@ Shear-rate 500 sec$^{-1}$, 280° C.) in the range of 200~1200 poise is prepared by performing the melt-extrusion under the conditions of a twin screw extruder temperature of 240~265° C. and a polymer retention time of within 1 minute.

In addition, the agglomeration of the polyester resin, the inorganic particles, and the fluorescence whitening agent is filtered at the fore end of the twin screw extruder and a screen-change filter of 300~500 mesh (mesh is the unit indicating a net eye of a stainless net, and means the number of net eyes in a distance of 1 inch (24.5 mm) and corresponds to 46~28 microns based on the filter size) is used in order to increase the shear stress, so that there can be provided a master batch in which dispersibility of the inorganic particles and the fluorescence whitening agent is uniform.

More specifically, in the step a), the first master batch chip may be prepared by mixing 40~60 wt % of the polyester resin powder, 40~60 wt % of rutile type titanium dioxide, and 300~3000 ppm of the benzoxazole based fluorescence whitening agent, and then feeding the mixture into a twin screw extruder including a vacuum vent and a 300~500 mesh screen change filter installed at the fore end of the twin screw extruder, following by melt-extrusion at an extruder temperature of 240~265° C.

In addition, in the step a), at the time of preparing the first master batch chip, an additive selected from oxazoline based thickener, oleic acid, and mixtures thereof may be further included.

Here, the oxazoline based thickener is preferably added in a content of 50~700 ppm based on the total weight of the film, and the oleic acid is preferably added in a content of 40~400 ppm based on the total weight of the film.

In the step b), the first master batch chip is preferably mixed with the second polyester resin chip such that the content of the first master batch chip includes 10~20 wt % of rutile type titanium dioxide and 100~900 ppm of benzoxazole based fluorescence whitening agent based on the total content of the film. In order to prevent the deterioration in mixability between chips due to the difference in specific gravity when the first master batch chip and the second polyester resin chip are fed into the extruder, a separator is preferably installed inside the hopper at an upper end of the extruder and a quantitative supply apparatus (side feeder that can control the addition amount of chips by regulating the number of rotation) for feeding the master batch chip is preferably provided at a side surface of the hopper which is positioned at a start point side of the progress direction of the extruder based on the separator.

The polyester resin chip is fed into an upper portion of the hopper at one side of the separator and the first master batch chip containing the rutile type titanium dioxide and benzoxazole based fluorescence whitening agent is fed into the other side of the separator by using the side feeder capable of feeding chips at a predetermined number of rotation, and then the polyester resin chip and the master batch chip are mix-extruded by an inner screw of the extruder though rotation of the extruder, to thereby improve mixability regardless of the differences in size and specific gravity of the chip.

In addition, in order to improve mixability between the polyester resin and the master batch chip, the melt-extrusion temperature is preferably performed at a temperature of 280~320° C. in the step b).

In the step c), the film is prepared through stretching. The unstretched sheet is stretched in the machine direction (MD) at a ratio of 2.0~4.0 times by IR heater non-contact irradiation of between 500~900° C. while passing through a preheating roll of 80~100° C., cooled to 20~35° C., again preheated at 100~125° C., and then biaxially stretched at a ratio of 3.0~4.0 times in the traverse direction (TD) at a stretching temperature of 125~140° C.

The stretched sheet may be heat-treated at a temperature range of 200~240° C. and then relaxed on the 5~10 stage tenter. The film may be relaxed at a ratio of 1~10% based on the length in the traverse direction, resulting in giving thermal shrinkage and shape stability to the film.

In the present invention, the overall thickness of the film is preferably 50~300 μm. If the overall thickness thereof is below 50 μm, the light reflectance, durability, and weather resistance are not sufficient. If above 300 μm, the stretching stress is extremely high without a large increase in reflectance, and thus the film-manufacturing processability is largely decreased and delamination may occur in the surface layer.

The polyester white film manufactured by the manufacturing method of the present invention may satisfy physical properties of a whiteness index of 100 or higher, reflectance of 90% or higher at 550 nm, MD thermal shrinkage of 2.0% or lower at 150° C. after 30 minutes, a color difference (ΔE) of 2.0 or less after irradiation of QUV (1.23 W/m²×340 nm×60° C.×99 hours), and MD elongation retention of 50% or higher at 121° C. and RH 100% after 50 hours. The polyester white film satisfying physical properties of the above range is appropriate in being used for a back sheet for a solar cell module. A polyester white film that does not satisfy any one of the above physical properties cannot achieve the object of the present invention.

The whiteness index is 100 or higher, preferably 100~110, and more preferably 104~108. If the whiteness index is below 100, the effect of increasing the desired light reflecting efficiency is less. As the light reflecting efficiency increases, the generation efficiency by photo-conversion in the solar cell module may increase to 0.2~0.5%.

In addition, the reflectance at 550 nm is 90% or higher, preferably 92~99%, more preferably 95~99%, and still more preferably 97~99%. If the reflectance is below 90%, the recycling effect of light is low and thus the effect of increasing the generation efficiency by photo-conversion of the solar cell module is less.

In addition, the MD thermal shrinkage (150° C.×30 min, @Oven) is 2.0% or less, preferably 0.5~1.8%, and more preferably 1.0~1.6%. If the thermal shrinkage is above 2.0%, the heat resistance characteristics may be deteriorated, which cause a large difference in physical properties due to heat, unfavorably.

In addition, the color difference (ΔE) after irradiation of QUV (1.23 W/m2×340 nm×60° C.×99 hours) is 2.0 or less, preferably 0~1.6, and more preferably 0~0.5. If the color difference (ΔE) is above 2.0, UV stability may be significantly decreased, resulting in lowering long-term durability.

In addition, the MD elongation retention after PCT (121° C.×RH100%×50 hours) is 50% or higher, preferably 50%~100%, and more preferably 70~100%. If the elongation retention is below 50%, the physical properties are rapidly deteriorated and thus long-term durability is deteriorated.

Hereinafter, the present invention will be described by the examples in detail, but the present invention is not limited to the following examples.

Hereinafter, physical properties of the present invention were measured as follows.

1) Whiteness Index 10 sheets of measurement samples were taken from within 1 m in a machine direction (MD) of the entire width of a film roll. After that, the whiteness index for each sample was measured by using a spectrophometer colorimeter (Datacolor 600, Datacolor Company), and then an average value for 8 samples excluding the maximum value and the minimum value was obtained, which was determined as a whiteness index.

2) Reflectance (%)

10 sheets of measurement samples were taken from within 1 m in the machine direction (MD) of the entire width of a film roll. After that, the reflectance at 550 nm for each sample was measured by using a spectrophometer (UV Spectrophotometers Cary 5000, Varian Company), and then an average value for 8 samples excluding the maximum value and the minimum value was obtained, which was determined as a reflectance.

Here, the reflectance of the film is relative reflectance when reflectance of a barium sulfate standard white plate is 100% in the above meter, and is measured at a visible light of 550 nm. Here, the measurement angle was 3° 20″; the average time for signal detection by a detector was 0.1 s; the analysis data interval was 1 nm; and the scan rate was 600 nm/min.

3) Thermal Shrinkage (150° C.×30 Minute)

The film was cut out in a forward direction of 200 mm×200 mm with respect to the MD and TD, and the lengths of the film in the MD and TD were measured. After that, this film was subjected to thermal shrinkage for 30 minutes under the non-load in an oven of 150° C. The lengths in the MD and TD of the thermally shrunken film were measured and the thermal shrinkage in MD and TD were obtained according to Equation 1:

$$\text{Thermal Shrinkage (\%)} = \frac{\text{Length before Shrinkage} - \text{Length after Shrinkage}}{\text{Length before Shrinkage}} \times 100 \qquad [\text{Equation 1}]$$

4) Color Difference (ΔE), after Irradiation of QUV (1.23 W/m2×340 nm×60° C.×99 Hours)

20 sheets of measurement samples were taken from within 2 m in the machine direction (MD) of the entire width of a film roll. After that, the L, a, and b* values for each of 10 samples were measured by using a spectrophometer colorimeter (Datacolor 600, Datacolor Company), to obtain averages of L, a, and b* values for 10 samples, which were determined as L0, a0, and b*0 values.

The other 10 samples taken were subjected to UV irradiation by using the Accelerated Weathering Tester (model name: QUV/SPRAY, Q-Lab Company) under the conditions of UV lamp irradiation intensity of 1.23 W/m2, UV irradiation wavelength of 340 nm, temperature of 60° C., and irradiation time of 99 hours. After that, the samples were taken out of the UV irradiation apparatus and then maintained at room temperature for 24 hours. The L, a, and b* values for each of the 10 samples after the UV irradiation were measured by using a spectrophometer colorimeter (Datacolor 600, Datacolor Company), to obtain averages of L, a, and b* values for 10 samples, which were determined as L1, a1, and b*1 values.

The color difference (ΔE) after QUV irradiation was obtained according to Equation 2 by using the averages of L, a, and b* values before UV irradiation and after UV irradiation.

$$\Delta E = \text{SQRT}[(L_0 - L_1)^2 + (a_0 - a_1)^2 + (b^*_0 - b^*_1)^2] \quad \text{[Equation 2]}$$

(where, SQRT means the square root value.)

5) MD Elongation Retention (%), after PCT (Pressure Cooker Test; 121° C.×RH100%×50 Hours)

2 sheets of measurement samples having a size of 300 mm×200 mm in the MD as a vertical direction and the TD as a horizontal direction were taken from within 5 m in the MD of a film roll. First, one sample taken was made into a sample for measuring physical properties, which has a size of 300 mm×15 mm in the MD and TD. After that, the cut elongation in the MD of the film before PCT treatment was measured 10 times by using the Tensile Test Machine (Instron Company) under the conditions of a measurement sample width of 15 mm, a gauge length of 50 mm, and a cross head-up speed of 500 mm/min, and an average thereof excluding the maximum value and the minimum value was obtained.

The other sample (MD×TD lengths; 300 mm×200 mm) taken is successively cut at an interval of 15 mm in TD and 200 mm in MD based on one corner by a knife ten times, so that a film having a size of 200 mm×15 mm (MD×TD) is hung at one sample. After that, a hole is punched in the sample at a position of 270 mm from a cut start point in the TD. This sample is hung at a sample hanger inside an autoclave such that it is not immersed in water, and then subjected to aging for 50 hours under the conditions of high temperature and high humidity of 121° C.×100% RH×2 bar. Upon completion of the aging, the sample was taken out of the autoclave, and maintained at room temperature for 24 hours. A small sample having a size of 200 mm×15 mm, which has been cut by a knife in advance before the aging, was taken from the sample. After that, the cut elongation in MD of the small sample after PCT treatment was measured 10 times by using the Tensile Test Machine (Instron Company) under the conditions of a measurement sample width of 15 mm, a gauge length of 50 mm, and a cross head-up speed of 500 mm/min, and an average thereof excluding the maximum value and the minimum value was obtained.

The MD elongation retention after PCT was obtained according to Equation 3 below by using MD elongation values before PCT treatment and after PCT treatment.

$$MD \text{ Elongation Retention } [\%], \text{ after } PCT = \frac{MD \text{ Elongation after } PCT}{MD \text{ Elongation before } PCT} \times 100 \quad \text{[Equation 3]}$$

6) Intrinsic Viscosity (I.V.; dl/g)

Ortho Chloro Phenol (OCP) was dissolved at 160±2° C., and then viscosity of the sample at the viscosity tube was measured in the conditions of 25° C. by using the auto-viscosity measurement instrument (Skyvis-4000), which was then used to obtain the intrinsic viscosity (IV) of the sample according to Equation 4 below.

$$\text{Intrinsic Viscosity } (IV) = \{(0.0242 \times Rel) + 0.2634\} \times F \quad \text{[Equation 4]}$$

$$Rel = \frac{\text{Seconds of Solution} \times \text{Specific Gravity of Solution} \times \text{Viscosity Coefficient}}{OCP \text{ Viscosity}}$$

$$F = \frac{I.V. \text{ of Standard Chip}}{\text{Average Value of three } I.V. \text{ Measured from Standard Chip with Standard Action}}$$

7) Melt Viscosity (M.V.; Poise)

After the master batch chip was dried in the vacuum drier at 160° C. for 10 hours, the melt viscosity (poise) of the master batch chip was obtained under the conditions of a temperature of 280° C. and a shear rate of 500 sec-1 by using a melt viscosity measurement instrument (Rheo-Tester, Gottfert Company).

Example 1

Preparation of First Master Batch Chip

A first polyethylene terephthalate chip having intrinsic viscosity of 0.85 dl/g was processed into a powder type at room temperature by using a grinder. The polyethylene terephthalate chip powder 200 Kg (50 wt %), rutile type titanium dioxide having an average particle size of 0.22 μm 199.52 Kg (49.88 wt %), and benzoxazole based fluorescence whitening agent (OB-1, Eastman Company) 0.48 Kg (1200 ppm, 0.12 wt %) were blended by using a quantitative feeder. After that, this blend was fed into a twin screw extruder installed with the vacuum vent, and then melt-extruded by being passed through a 400 mesh screen changer filter at the fore end of the extruder while the retention time in the extruder was 25 seconds at 245° C., to thereby prepare a first master batch chip (A).

As the result of measurement of physical properties of the prepared first master batch chip (A), the melt viscosity was 315 poise (@280° C., Shear-rate 500 sec$^{-1}$).

Manufacture of Film

The prepared first master batch chip (A) and a second polyethylene terephthalate chip having intrinsic viscosity of 0.85 dl/g were fed into the extruder. Here, in order to prevent a deterioration in mixability between chips due to weight difference, a separator was installed inside a hopper and a quantitative supply apparatus (side feeder) for feeding the master batch chip is provided at a side surface of the hopper which is positioned at a start point side of the progress direction of the extruder based on the separator. The polyethylene terephthalate chip was fed into an upper portion of the hopper at one side of the separator and the master batch chip was fed into the other side of the separator by using the side feeder capable of feeding chips at a predetermined number of rotation, and then the polyethylene terephthalate chip and the master batch chip were mix-extruded by an inner screw of the extruder though rotation of the extruder, to thereby solve the mixability problems due to the differences in size and weight of chip.

40 wt % of the first master batch chip (A) (19.95 wt % of rutile type titanium dioxide and 480 ppm of a fluorescence whitening agent based on the entire film) and 60 wt % of the second polyethylene terephthalate chip were used. These were fed into the extruder and melted at 285° C., and then an unstretched sheet was prepared by a casting roll of 21° C. (cooling roll) while being extruded through the T-die. Here, the retention time within the casting roll was 22.5 seconds, and the casting rate was 12.5 m/min, and the temperature of the air chamber was 20° C. The unstretched sheet was stretched at a ratio of 3.0 times in a machine direction (MD) at an IR heater temperature of 860° C. by passing though a preheated roll at 92° C., cooled by passing through a cooling roll at 22° C., consecutively, stretching at a ratio of 3.85 times in the traverse direction (TD) at 130° C. by passing through a preheated section at 120° C., subjected to heat treatment at 225° C., and then subjected through a relaxing process of 5.0% at 200° C., to thereby manufacture a film having an overall thickness of 188 μm.

Physical properties of the manufactured white film were measured, and the measured results were tabulated in Table 1.

Example 2

Preparation of First Master Batch Chip

A first master batch chip (B) was prepared by the same method as Example 1. The composition of the master batch chip was polyethylene terephthalate chip powder 180 Kg (45 wt %), rutile type titanium dioxide having an average particle size of 0.4 μm 218.2 Kg (54.55 wt %), benzoxazole based fluorescence whitening agent (OB-1, Eastman Company) 1.0 Kg (2500 ppm, 0.25 wt %), and oxazoline based thickener (Chain-Extender) 0.8 Kg (2000 ppm, 0.20 wt %). The first master bath chip (B) was prepared by using a 350 mesh screen changer filter at the fore end of the extruder while the extruder temperature was 260° C. and the retention time in the extruder was 55 seconds.

As the result of measuring of the physical properties of the prepared first master batch chip (B), the melt viscosity was 850 poise (@280° C., Shear-rate 500 sec$^{-1}$).

Manufacture of Film

The film was manufactured by the same method as Example 1. An unstretched sheet was prepared by feeding the first master batch chip (B) 30 wt % (based on the entire film, rutile type titanium dioxide 16.37 wt %, fluorescence whitening agent 750 ppm, and oxazoline based thickener 600 ppm) and a second polyethyleneterephthalate chip 70 wt % having intrinsic viscosity of 0.85 dl/g into the extruder while the extruder temperature was 295° C. A film having an overall thickness of 188 μm was manufactured in the same manner except that the retention time in the casting roll was 18.8 seconds, the casting rate was 15.0 m/min, the stretching ratio in the machine direction (MD) was 3.2 times, and the stretching ratio in the traverse direction (TD) was 3.1 times.

Physical properties of the manufactured white film were measured, and the measured results were tabulated in Table 1.

Example 3

Preparation of First Master Batch Chip

In preparing a master batch chip (C), the composition of the master batch chip was polyethylene terephthalate chip powder 200 Kg (50 wt %), rutile type titanium dioxide having an average particle size of 0.22 μm 198.2 Kg (49.55 wt %), benzoxazole based fluorescence whitening agent (OB-1, Eastman Company) 0.6 Kg (1500 ppm, 0.15 wt %), oxazoline based thickener (Chain-Extender) 0.8 Kg (2000 ppm, 0.20 wt %), and oleic acid 0.4 kg (1000 ppm, 0.10 wt %). The master bath chip (C) was prepared by using a 400 mesh screen changer filter at the fore end of the extruder while the extruder temperature was 240° C. and the retention time in the extruder was 10 seconds.

As the result of measurement of physical properties of the prepared master batch chip (C), the melt viscosity was 1100 poise (@280° C., Shear-rate 500 sec$^{-1}$).

Manufacture of Film

The film was manufactured by the same method as Example 1. An unstretched sheet was prepared by feeding the master batch chip (C) 21 wt % (based on the entire film, rutile type titanium dioxide 10.41 wt %, fluorescence whitening agent 315 ppm, oxazoline based thickener 420 ppm, and oleic acid 210 ppm) and a second polyethyleneterephthalate chip 79 wt % having intrinsic viscosity of 0.85 dl/g into the extruder while the extruder temperature was 295° C. A film having an overall thickness of 250 μm was manufactured in the same manner except that the retention time in the casting roll was 25.5 seconds, the casting rate was 11.3 m/min, the stretching ratio in the machine direction (MD) was 3.1 times, and the stretching ratio in the traverse direction (TD) was 3.1 times.

Physical properties of the manufactured white film were measured, and the measured results were tabulated in Table 1.

Comparative Example 1

A film having an overall thickness of 188 μm was manufactured by the same method as Example 1 using the same composition except that barium sulfate (BaSO$_4$) having an average particle size of 0.85 μm was used as an inorganic particle in preparing a master batch chip (D).

Physical properties of the manufactured white film were measured, and the measured results were tabulated in Table 1.

Comparative Example 2

In preparing a first master batch chip (E), a fluorescence whitening agent was not used.

The composition of the master batch chip was polyethylene terephthalate chip powder 180 Kg (45 wt %), rutile type titanium dioxide having an average particle size of 0.4 μm 219.2 Kg (54.8 wt %), and oxazoline based thickener (Chain-Extender) 0.8 Kg (2000 ppm, 0.20 wt %). The first master bath chip (E) was prepared by using a 350 mesh screen changer filter at the fore end of the extruder while the extruder temperature was 260° C. and the retention time in the extruder was 55 seconds.

As the result of measurement of physical properties of the prepared first master batch chip (E), the melt viscosity was 850 poise (@280° C., Shear-rate 500 sec$^{-1}$).

Manufacture of Film

The film was manufactured by the same method as Example 1. An unstretched sheet was prepared by feeding the first master batch chip (E) 30 wt % (based on the entire film, rutile type titanium dioxide 16.44 wt % and oxazoline based thickener 600 ppm) and a second polyethyleneterephthalate chip 70 wt % having intrinsic viscosity of 0.85 dl/g into the extruder while the extruder temperature was 295° C. A film having an overall thickness of 188 μm was manufactured in the same manner except that the retention time in the casting roll was 18.8 seconds, the casting rate was 15.0 m/min, the stretching ratio in the machine direction (MD) was 3.2 times, and the stretching ratio in the traverse direction (TD) was 3.1 times.

Physical properties of the manufactured white film were measured, and the measured results were tabulated in Table 1.

Comparative Example 3

A film was manufactured by the same method as Example 1 except that the first master batch chip (A) of Example 1 wt % (based on the entire film, rutile type titanium dioxide 7.84 wt % and a fluorescence whitening agent 180 ppm) and the second polyethyleneterephthalate chip 85 wt % were used.

Physical properties of the manufactured white film were measured, and the measured results were tabulated in Table 1.

Comparative Example 4

A film was manufactured by the same method as Example 1 except that the first master batch chip (A) of Example 1 60 wt % (based on the entire film, rutile type titanium dioxide 29.93 wt % and a fluorescence whitening agent 720 ppm) and the second polyethyleneterephthalate chip 40 wt % were used.

Physical properties of the manufactured white film were measured, and the measured results were tabulated in Table 1.

Comparative Example 5

Preparation of First Master Batch Chip

In preparing a master batch chip (F), the composition of the master batch chip was polyethylene terephthalate chip powder 200 Kg (50.25 wt %), rutile type titanium dioxide having an average particle size of 0.22 μm 197.9 Kg (49.72 wt %), and benzoxazole based fluorescence whitening agent (OB-1, Eastman Company) 0.1 Kg (251 ppm, 0.025 wt %). The master bath chip (F) was prepared in the same manner except that the extruder temperature was 2400, the retention time in the extruder was 10 seconds, and a 400 mesh screen changer filter at the fore end of the extruder was used.

Manufacture of Film

The film was manufactured by the same method as Example 1. An unstretched sheet was prepared by feeding the master batch chip (F) 30 wt % (based on the entire film, rutile type titanium dioxide 14.92 wt % and benzoxazole based fluorescence whitening agent 75 ppm) and a second polyethyleneterephthalate chip 70 wt % having intrinsic viscosity of 0.85 dl/g into the extruder while the extruder temperature was 295° C. A film having an overall thickness of 188 μm was manufactured in the same manner except that the retention time in the casting roll was 18.8 seconds, the casting rate was 15.0 m/min, the stretching ratio in the machine direction (MD) was 3.2 times, and the stretching ratio in the traverse direction (TD) was 3.1 times.

Physical properties of the manufactured white film were measured, and the measured results were tabulated in Table 1.

Comparative Example 6

Preparation of First Master Batch Chip

In preparing a master batch chip (G), the composition of the master batch chip was polyethylene terephthalate chip powder 200 Kg (50 wt %), rutile type titanium dioxide having an average particle size of 0.22 μm 199 Kg (49.75 wt %), and benzoxazole based fluorescence whitening agent (OB-1, Eastman Company) 1.0 Kg (2500 ppm, 0.25 wt %. The master bath chip (G) was prepared in the same manner except that the extruder temperature was 240° C., the retention time in the extruder was 10 seconds, and a 400 mesh screen changer filter at the fore end of the extruder was used.

Manufacture of Film

The film was manufactured by the same method as Example 1. An unstretched sheet was prepared by feeding the master batch chip (G) 40 wt % (based on the entire film, rutile type titanium dioxide 19.9 wt % and benzoxazole based fluorescence whitening agent 1000 ppm) and a second polyethyleneterephthalate chip 60 wt % having intrinsic viscosity of 0.85 dl/g into the extruder while the extruder temperature was 295° C. A film having an overall thickness of 188 μm was manufactured in the same manner except that the retention time in the casting roll was 18.8 seconds, the casting rate was 15.0 m/min, the stretching ratio in the machine direction (MD) was 3.2 times, and the stretching ratio in the traverse direction (TD) was 3.1 times.

Physical properties of the manufactured white film were measured, and the measured results were tabulated in Table 1.

TABLE 1

| | Whiteness index | Reflectance (%) | MD Thermal Shrinkage | Color Difference (ΔE) | MD Elongation Retention (%), after PCT |
|---|---|---|---|---|---|
| Example 1 | 108 | 97.3 | 1.3 | 0.5 | 54.7 |
| Example 2 | 107 | 95.2 | 1.6 | 1.6 | 63.8 |
| Example 3 | 104 | 92.3 | 1.0 | 0.3 | 75.4 |
| Comparative Example 1 | 126 | 94.2 | 2.5 | 2.2 | 15.6 |
| Comparative Example 2 | 96 | 88.7 | 1.6 | 1.6 | 62.7 |
| Comparative Example 3 | 90 | 81.2 | 1.5 | 0.6 | 78.2 |
| Comparative Example 4 | 113 | 97.5 | 1.2 | 0.4 | 10.3 |
| Comparative Example 5 | 92 | 87.3 | 1.4 | 1.9 | 66.1 |
| Comparative Example 6 | 110 | 97.7 | 1.4 | 3.5 | 56.7 |

It may be seen from Table 1 above that examples of the present invention satisfy all the physical properties of a whiteness index of 100 or higher, reflectance of 90% or higher at 550 nm, MD thermal shrinkage of 2.0% or lower at 150° C. after 30 minutes, a color difference (ΔE) of 2.0 or less after irradiation of QUV (1.23 W/m²×340 nm×60° C.×99 hours), and MD elongation retention of 50% or higher at 121° C. and RH 100% after 50 hours, and thus is appropriate in being used as a back sheet for a solar cell module.

Comparative Example 1 corresponds to a case where barium sulfate was used instead of rutile type titanium dioxide. It may be seen that, regardless of the same content as Example 1, the reflectance was lower, the whiteness index was high, and thermal shrinkage, color difference, and MD elongation retention were worse.

In addition, Comparative Example 2 corresponds to a case where benzoxazole based fluorescence whitening agent was not used. It may be seen that the whiteness index and reflectance were lower and the light reflecting efficiency was decreased as compared with Example 2 experimented in the same conditions.

In addition, it may be seen from Comparative Examples 3 and 4 that, in the case where the content of rutile type titanium dioxide is below the range of the present invention, the whiteness index and reflectance were low, and thus a single layer thereof was difficult to apply as a back sheet, and in the case where the content was above the range of the present invention, the casting sheet was highly crystallized, which may cause sheet brittleness and brokenness, resulting in difficult stretching, and thus film-forming stability was severely deteriorated.

In addition, it may be from Comparative Examples 5 and 6 that, in the case where the content of benzoxazole based fluorescence whitening agent is below the range of the present invention, the whiteness index and light reflectance were deteriorated, and in the case where the content was above the range of the present invention, the whiteness index and the reflectance were increased, but UV stability was decreased, and thus a yellowing phenomenon environment was exhibited at the time of long-term exposure to the external environment, and the whiteness index and the reflectance can be deteriorated.

The invention claimed is:

1. A polyester white film for back sheet for a solar cell module,
    said polyester white film having a whiteness index of 100 or higher, a reflectance of 90% or higher at 550 nm, a machine direction (MD) thermal shrinkage of 2.0% or lower at 150° C. after 30 minutes, a color difference (ΔE) of 2.0 or less after irradiation of QUV at 1.23 W/m²×340 nm×60° C.×99 hours, and an MD elongation retention of 50% or higher at 121° C. and RH 100% after 50 hours,
    wherein the polyester white film comprises a matrix resin made of a polyester resin, a rutile type titanium dioxide, a benzoxazole based fluorescence whitening agent, an oxazoline based thickener, and an oleic acid;
    wherein the rutile type titanium dioxide is contained in a content of 10-20 wt % and the benzoxazole based fluorescence whitening agent is contained in a content of 100-900 ppm, both based on the total weight of the film; and
    wherein the oxazoline based thickener is contained in a content of 50-700 ppm based on, the total weight of the film, and the oleic acid is contained in a content of 40-400 ppm based on the total weight of the film.

2. The polyester white film of claim 1, wherein the rutile type titanium dioxide has an average particle size of 0.1-0.5 μm.

3. The polyester white film of claim 1, wherein the polyester resin is polyethylene terephthalate.

4. A back sheet for a solar cell module, wherein the back sheet is made of the polyester white film of claim 1, or comprises one or more layers of the polyester white film of claim 1.

5. A method for manufacturing a polyester white film for back sheet for a solar cell module, the method comprising:
    a) preparing a first master batch chip by mixing a polyester resin powder obtained by pulverizing a first polyester resin chip, a rutile type titanium dioxide, a benzoxazole-based fluorescence whitening agent, an oxazoline based thickener, and an oleic acid, followed by melt-extrusion at an extruder temperature of 240-265° C.,
    wherein the oxazoline based thickener is added in a content of 50-700 ppm based on the total weight of the film, and the oleic acid is added in a content of 40-400 ppm based on the total weight of the film;
    b) preparing an unstretched sheet by feeding the first master batch chip and a second polyester resin chip into an extruder, followed by melt-extrusion at a temperature of 280-320° C.; and
    c) preparing a film by uniaxially or biaxially stretching the unstretched sheet,
    wherein in the step b), the first master batch chip comprises 10-20 wt % of the rutile type titanium dioxide and 100-900 ppm of the benzoxazole-based fluorescence whitening agent, both based on the total weight of the film,
    wherein the polyester white film has a whiteness index of 100 or higher, a reflectance of 90% or higher at 550 nm, a machine direction (MD) thermal shrinkage of 2.0% or lower at 150° C. after 30 minutes, a color difference (ΔE) of 2.0 or less after irradiation of QUV at 1.23 W/m²×340 nm×60° C.×99 hours, and an MD elongation retention of 50% or higher at 121° C. and RH 100% after 50 hours.

6. The method of claim 5, wherein in the step a), at the time of preparing the first master batch chip, a twin screw extruder with a vacuum vent is used while the extruder temperature is 240-265° C. and the retention time of polymer within the extruder is 1 minute or less, and a 300-500 mesh screen change filter at the front end of the twin screw extruder is used to implement uniform mixing.

* * * * *